(12) United States Patent
Ko

(10) Patent No.: US 7,642,169 B2
(45) Date of Patent: Jan. 5, 2010

(54) METHOD OF MAKING A BIPOLAR JUNCTION TRANSISTOR

(75) Inventor: Kwang Young Ko, Gyeonggi-do (KR)

(73) Assignee: Dongbu HiTek, Ltd., Seoul (KR)

( * ) Notice: Subject to any disclaimer, the term of this patent is extended or adjusted under 35 U.S.C. 154(b) by 481 days.

(21) Appl. No.: 11/615,741

(22) Filed: Dec. 22, 2006

(65) Prior Publication Data

US 2007/0158677 A1 Jul. 12, 2007

(30) Foreign Application Priority Data

Dec. 30, 2005 (KR) ...................... 10-2005-0134780

(51) Int. Cl.
*H01L 21/331* (2006.01)
(52) U.S. Cl. .................. 438/369; 257/E21.35; 438/335
(58) Field of Classification Search ................. 438/369, 438/370, 335, 339, 364; 257/E27.053, E27.027, 257/E29.034, E29.174, E21.35
See application file for complete search history.

(56) References Cited

U.S. PATENT DOCUMENTS 4,974,045 A * 11/1990 Okita .......................... 257/518
5,434,092 A * 7/1995 Neudeck et al. ............. 438/341
6,949,424 B2 * 9/2005 Springer ..................... 438/202
7,534,679 B2 * 5/2009 Rochel et al. ............... 438/202

* cited by examiner

*Primary Examiner*—Jerome Jackson, Jr.
*Assistant Examiner*—Paul A Budd
(74) *Attorney, Agent, or Firm*—Sherr & Vaughn, PLLC

(57) ABSTRACT

Embodiments relate to a bipolar junction transistor and a method for manufacturing the same. An oxide pattern may be formed on a P type semiconductor substrate. A low-density N type collector area may be formed in the semiconductor substrate. First spacers may be formed at sidewalls of the oxide pattern, and a low-density P type base area may be formed in the semiconductor substrate. Second spacers may be formed on sidewalls of the first spacers. A high-density N type emitter area may be formed in the low-density P type base area between the second spacers, and a high-density N type collector area may be formed in the semiconductor substrate at an outside of the first spacers. The bipolar junction transistor may be realized through a self-aligned scheme using dual nitride spacers. A base width between the emitter area and the low-density collector area may be narrowed by the width of the second spacer.

9 Claims, 4 Drawing Sheets

METHOD OF MAKING A BIPOLAR JUNCTION TRANSISTOR

The present application claims priority under 35 U.S.C. 119 and 35 U.S.C. 365 to Korean Patent Application No. 10-2005-0134780 (filed on Dec. 30, 2005), which is hereby incorporated by reference in its entirety.

BACKGROUND

Distinct from field effect transistors (FETs), electrons and holes may be current carriers in bipolar junction transistors (BJTS). Since the bipolar junction transistors may have fast operational speeds, bipolar junction transistors may be used in high-speed and high-frequency devices.

FIG. 1 illustrates a structure of a related art bipolar junction transistor.

Referring to FIG. 1, a high-density N type buried layer 12 may be formed on a semiconductor substrate, and formed with an isolation layer. N type well area 13 and high-density N type plug area 14 may be formed on the resultant structure. Low-density P type base area 15 may be formed in well area 13, and high-density N type emitter area 16 and high-density P type base area 17 may be formed in base area 15. Emitter area 16 and base area 17 may be connected to emitter layer 18 and base layer 19, which include polysilicon, and may be formed on the emitter area 16 and the base area 17, respectively. High-density N type collector area 20 may be formed in plug area 14. Emitter layer 18, base layer 19, and collector area 20 may be covered with inter-layer dielectric layer 21 and connected to contacts 22 formed in inter-layer dielectric layer 21, respectively.

To obtain a high-speed bipolar junction transistor, a base width (WB) thereof may be formed as narrowly as possible. However, since a related art bipolar junction transistor may have a planar type structure, it may be difficult to narrow the base width (WB). In addition, since base layer 19 and emitter layer 18 may be stacked to reduce base resistance, a manufacturing process may be complicated.

SUMMARY

Embodiments relate to a semiconductor manufacturing technology. Embodiments relate to a bipolar junction transistor and a method for manufacturing a bipolar junction transistor, that may be capable of minimizing a base width by using double spacers and improving a high speed characteristic.

Embodiments relate to a bipolar direction transistor, and a method to minimize a base width of a bipolar junction transistor that may improve high-speed characteristics of the bipolar junction transistor.

Embodiments relate to a method that may simplify a process for manufacturing a bipolar junction transistor.

In embodiments, a bipolar junction transistor may include a pair of first nitride spacers selectively formed on a P type semiconductor substrate with a prescribed interval, a pair of second nitride spacers formed at inner sidewalls of the first spacers while facing each other, a low-density N type collector area having a first depth and formed in the semiconductor substrate below the first spacer, a low-density P type base area having a second depth and formed in the semiconductor substrate between the first spacers while making contact with the low-density N type collector area, a high-density N type emitter area having a third depth and formed in the low-density P type base area between the second spacers, a high-density N type collector area formed in the semiconductor substrate at an outside of the first spacer while making contact with the low-density N type collector area, and a high-density P type base area 38 separated from the high-density N type collector area by a prescribed interval and formed in semiconductor substrate 30.

In embodiments, a width of a low-density P type base between the high-density N type emitter area and the low-density N type collector area may be identical to a width of the second spacer. In embodiments, the first depth of the low-density N type collector area may be shallower than the second depth of the low-density P type base area.

According to embodiments, a method for manufacturing a bipolar junction transistor may include forming an oxide pattern on a P type semiconductor substrate, forming a low-density N type collector area in the semiconductor substrate by performing an ion implantation process using the oxide patter as a mask, forming first spacers at sidewalls of the oxide pattern, forming a low-density P type base area in the semiconductor substrate by performing an ion implantation process using the first spacers as a mask, forming second spacers on sidewalls of the first spacers, removing the oxide layer pattern, forming a high-density N type emitter area in the low-density P type base area between the second spacers and forming a high-density N type collector area in the semiconductor substrate at an outside of the first spacers, by performing an ion implantation process using the first and second spacers as a mask, and forming a high-density P type base area in a prescribed area of the semiconductor substrate, which is separated from the high-density N type collector area by a prescribed interval.

DETAILED DESCRIPTION OF EMBODIMENTS

Figure 1:
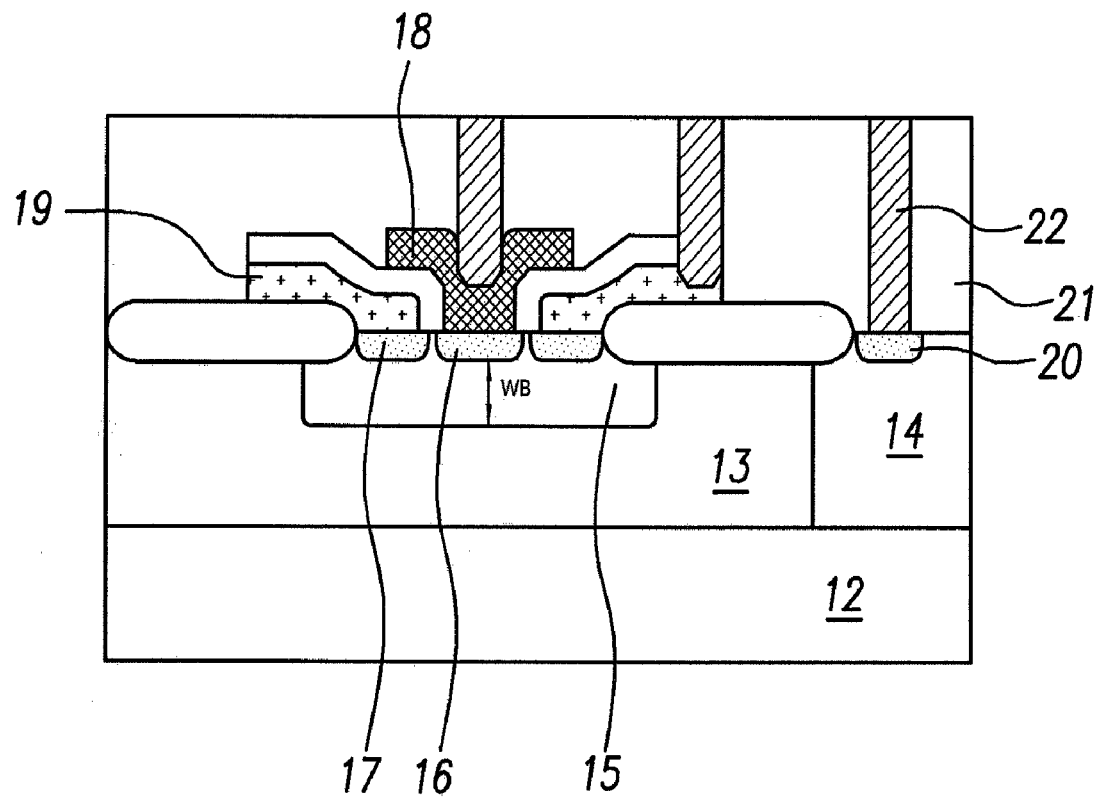
FIG. 1 is an example sectional diagram illustrating a structure of a related art bipolar junction transistor.
Figure 2:
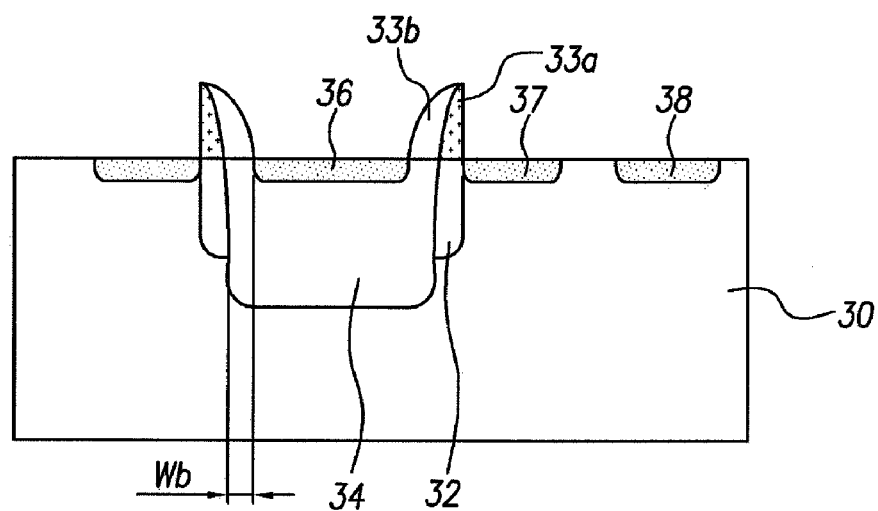
FIG. 2 is an example sectional diagram illustrating a structure of a bipolar junction transistor according to embodiments.

FIG. 2 is an example sectional diagram illustrating a structure of a bipolar junction transistor according to embodiments.

Referring to FIG. 2, a pair of first nitride spacers 33a may be selectively formed on a P type semiconductor substrate 30 at a prescribed interval. Second nitride spacers 33b may be formed at inner sidewalls of first spacers 33a while facing each other.

Low-density N type collector area 32 having a first depth may be formed in semiconductor substrate 30 below first spacer 33a. In addition, low-density P type base area 34 having a second depth may be formed in semiconductor substrate 30 between first spacers 33a. Accordingly, low-density N type collector area 32 may make contact with low-density P type base area 34. The first depth of low-density N type collector area 32 may be shallower than the second depth of low-density P type base area 34.

High-density N type emitter area 36 having a third depth may be formed in low-density P type base area 34 between second spacers 33b. Accordingly, a base width Wb between high-density N type emitter area 36 and low-density N type collector area 32 may be identical to the width of second spacer 33b. The third depth of high-density N type emitter area 36 may be shallower than the second depth of low-density P type base area 34.

High-density N type collector area 37 may be formed in semiconductor substrate 30 at an outside of first spacer 33a and may make contact with low-density N type collector area 32. A high-density P type base area 38, which may be separated from high-density N type collector area 37 by a prescribed interval, may be formed in semiconductor substrate 30.

Hereinafter, a method for manufacturing the bipolar junction transistor will be described.

Figure 3A:
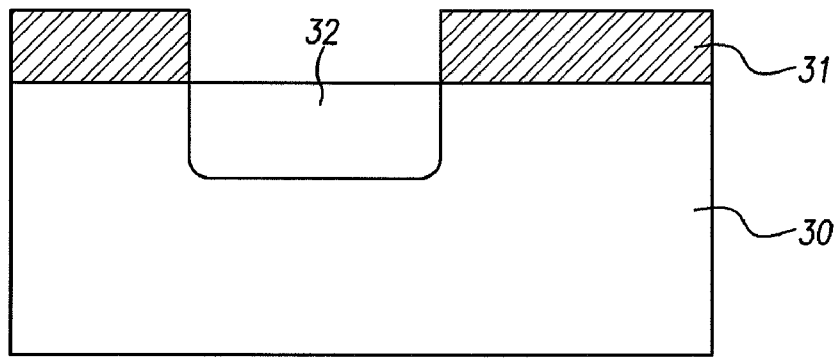
FIGS. 3A to 3F are example sectional views illustrating a bipolar junction transistor and a method for manufacturing a bipolar junction transistor according to embodiments.

Referring to FIG. 3A, an oxide layer may be deposited and patterned on the P type semiconductor substrate 30, and may form oxide pattern 31. Then, an ion implantation process may be performed, for examples by using oxide pattern 31 as a mask. This may form low-density N type collector area 32 with a prescribed depth in semiconductor substrate 30.

Figure 3B:
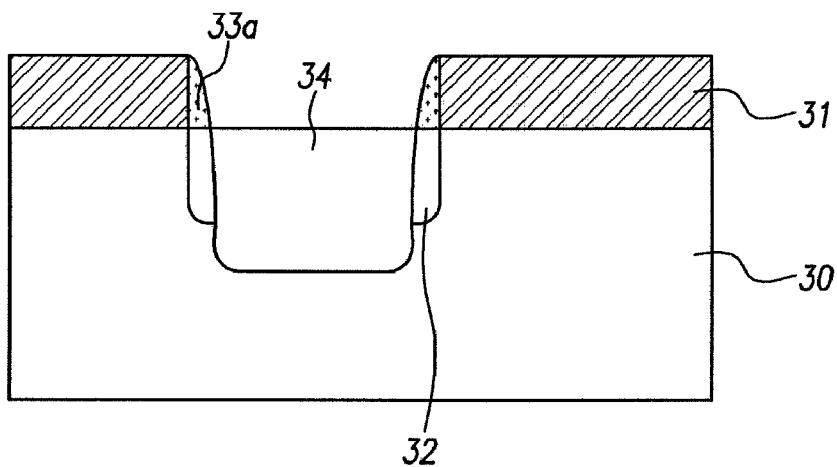

Referring to FIG. 3B, a nitride layer may be deposited on a surface (for example, the entire surface) of the resultant structure, and an anisotropic dry etching process may be performed. This may form first nitride spacers 33a at sidewalls of oxide pattern 31. An ion implantation process may then be performed, for example by using nitride spacers 33a as a mask. This may form low-density P type base area 34 having a prescribed depth in semiconductor substrate 30. Low-density P type base area 34, which is an intrinsic base, may be formed more deeply than low-density N type collector area 32.

Figure 3C:
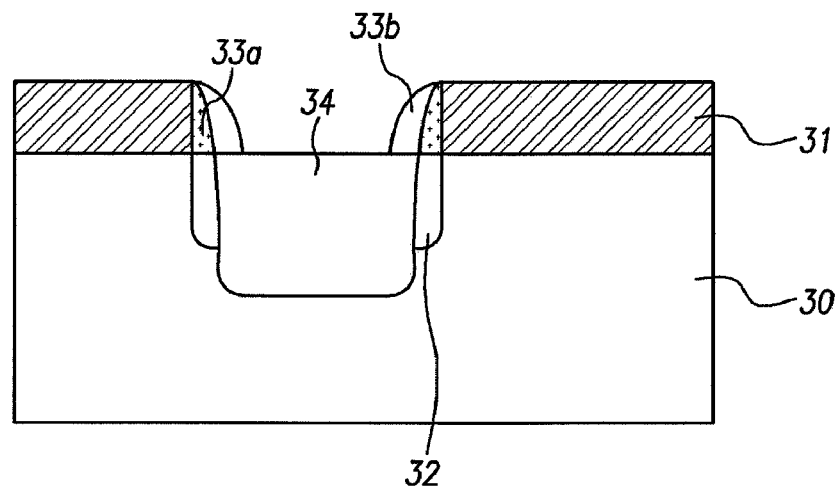

Referring to FIG. 3C, a nitride layer may be deposited. An anisotropic dry etching process may then be performed with respect to the resultant structure, and may form second nitride spacers 33b at sidewalls of first nitride spacers 33a.

Figure 3D:
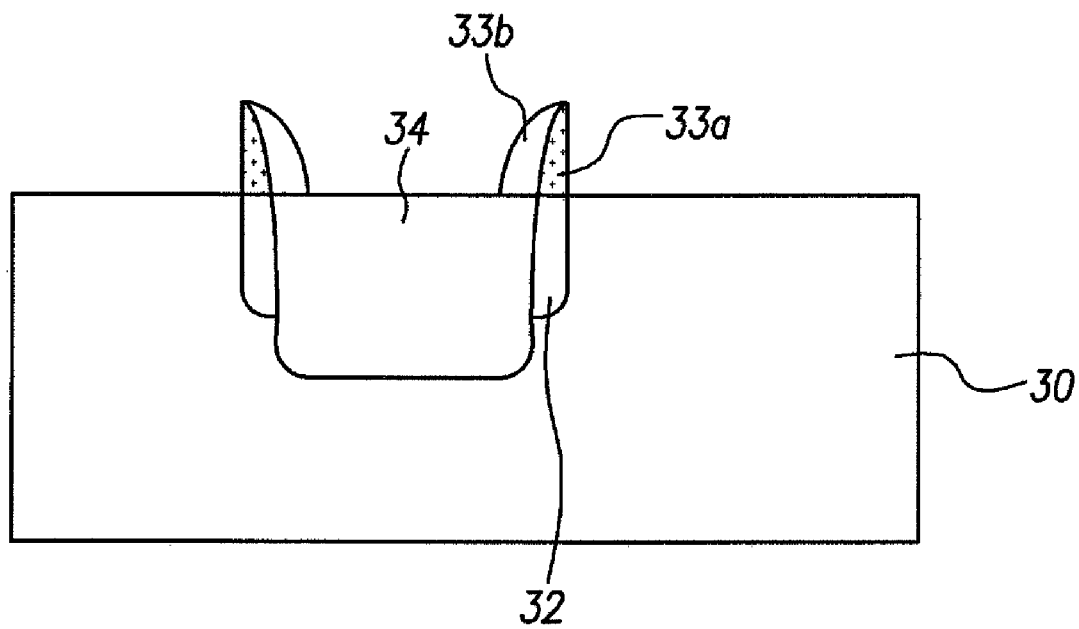

Referring to FIG. 3D, a wet etching process may be performed with respect to the resultant structure, and may entirely remove the oxide pattern.

Figure 3E:
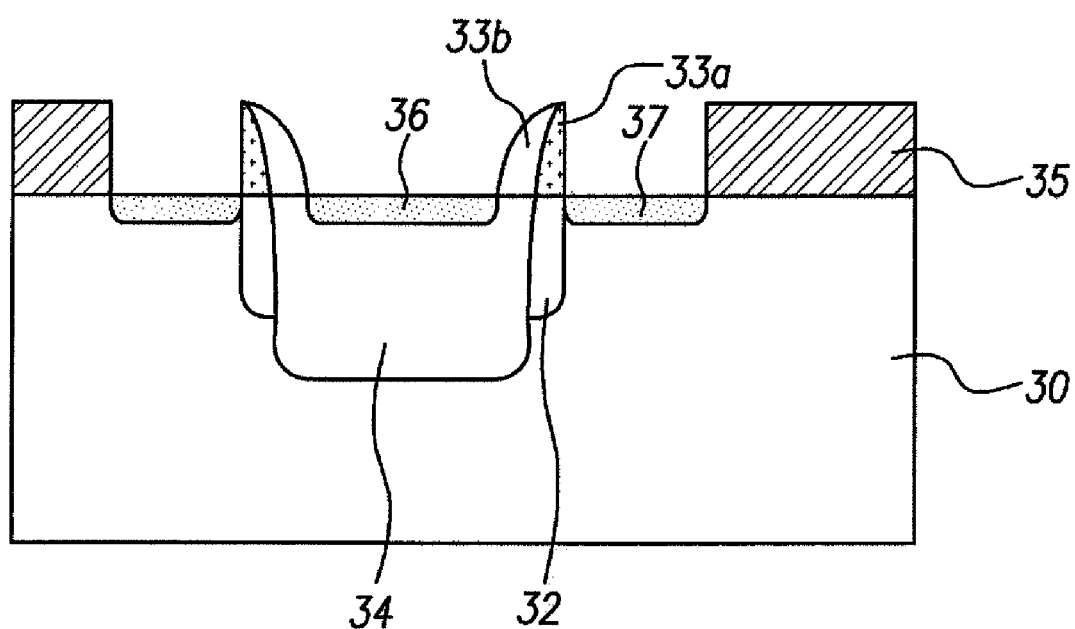

Referring to FIG. 3E, a photoresist pattern 35 may be formed on semiconductor substrate 30. An ion implantation process may then be performed, for example by using first and second nitride spacers 33a and 33b and photoresist pattern 35 as a mask. Accordingly, high-density N type emitter area 36 may be formed in low-density P type base area 34 between second nitride spacers 33b, and high-density N type collector area 37 may be formed in semiconductor substrate 30 between the first nitride spacer 33a and photoresist pattern 35. In embodiments, ion implantation depth of emitter area 36 may be shallower than ion implantation depth of low-density P type base area 34.

Figure 3F:
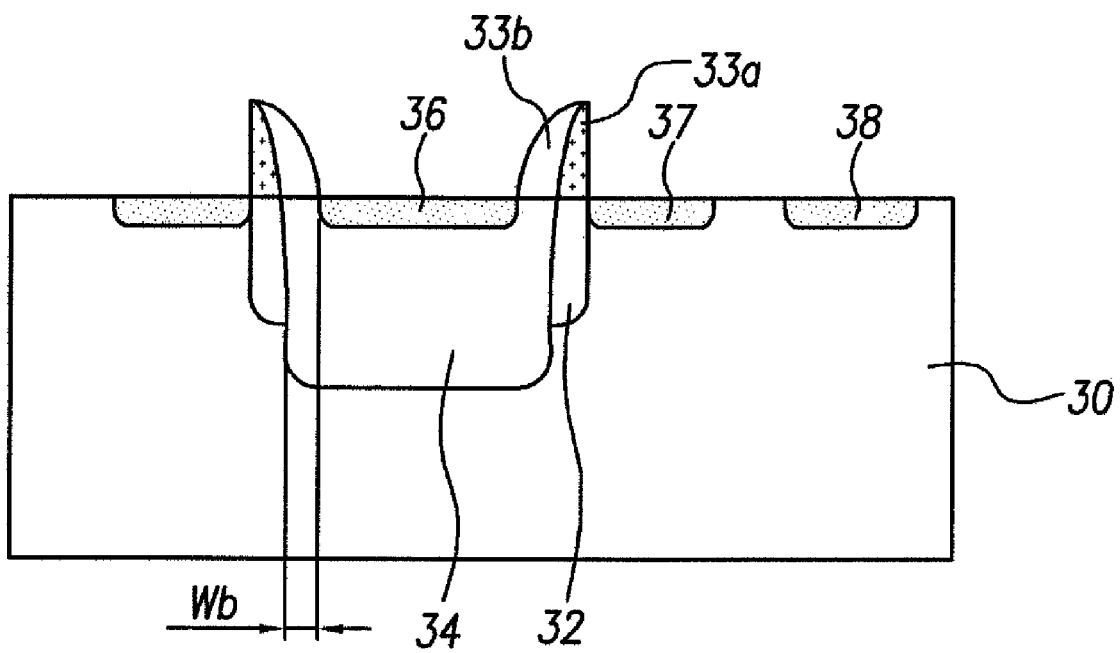

Referring to FIG. 3F, a photoresist pattern (not shown) may be formed on semiconductor substrate 30. An ion implantation process may then be performed, and may form high-density P type base area 38. The high-density P type base area 38 may be an extrinsic base, and may be separated from high-density collector area 37 with a prescribed interval in semiconductor substrate 30.

Subsequently, although not shown in drawings, a pre-metal dielectric (PMD) layer may be deposited such that the pre-metal dielectric (PMD) layer covers a surface (for example, the entire surface) of semiconductor substrate 30, and then may be selectively etched. In addition, a conductive material may be buried in the PMD layer, and may form contacts connected to high-density emitter area 36, the high-density base area 38, and high-density collector area 37, respectively.

In embodiments, a bipolar junction transistor may be obtained through a self-aligned scheme using dual nitride spacers.

In embodiments, a structure of a bipolar junction transistor and a method for manufacturing the same may be more simplified, and a base width between the emitter area and the low-density collector area may be narrowed by the width of the second spacer.

In embodiments, a bipolar junction transistor may have a simplified structure and a high-speed characteristic superior to that of a related art bipolar junction transistor having a planar structure.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming an oxide pattern over a P type semiconductor substrate;
   forming a low-density N type collector area in the semiconductor substrate by performing an ion implantation process using the oxide pattern as a mask;
   forming first spacers at sidewalls of the oxide pattern;
   forming a low-density P type base area in the semiconductor substrate by performing an ion implantation process using the first spacers as a mask;
   forming second spacers on sidewalls of the first spacers;
   removing the oxide layer pattern; and
   forming a high-density N type emitter area in the low-density P type base area between the second spacers and forming a high-density N type collector area in the semiconductor substrate at an outside of the first spacers, by performing an ion implantation process using the first and second spacers as a mask.

2. The method of claim 1, wherein the first and second spacers comprise nitride layers.

3. The method of claim 1, further comprising forming a high-density P type base area in a prescribed area of the semiconductor substrate, which is separated from the high-density N type collector area by a prescribed interval.

4. The method of claim 3, wherein a width of a low-density P type base in a region between the high-density N type emitter area and the low-density N type collector area is formed to be substantially identical to a width of a lower portion of one of the second spacers.

5. The method of claim 4, wherein a width of the low-density N type collector is formed to be substantially identical to a width of a lower portion of one of the first spacers.

6. The method of claim 3, wherein the high-density N type emitter area is formed in the low-density P type base area between inner edges of the second spacers.

7. The method of claim 3, wherein a depth of the low-density N type collector area is formed to be less than a depth of the low-density P type base area.

8. The method of claim 3, wherein a depth of the high-density N type emitter area is formed to be less than a depth of the low-density P type base area.

9. The method of claim 3, wherein a depth of the low-density N type collector area is less than a depth of the low-density P type base area, and a depth of the high-density N type emitter area is less than the depth of the low-density P type base area.

* * * * *